United States Patent
Lindoff et al.

[11] Patent Number: 6,101,224
[45] Date of Patent: Aug. 8, 2000

[54] METHOD AND APPARATUS FOR GENERATING A LINEARLY MODULATED SIGNAL USING POLAR MODULATION

[75] Inventors: Bengt Lindoff; Håkan Bengt Eriksson, both of Lund, Sweden

[73] Assignee: Telefonaktiebolaget LM Ericsson, Stockholm, Sweden

[21] Appl. No.: 09/167,658

[22] Filed: Oct. 7, 1998

[51] Int. Cl.[7] .................................................. H03C 1/52
[52] U.S. Cl. ...................... 375/300; 375/296; 332/145; 332/151; 455/102
[58] Field of Search .................................. 375/295, 296, 375/300, 308; 332/145, 151, 160, 149; 455/62, 102, 126

[56] References Cited

U.S. PATENT DOCUMENTS

| | | | |
|---|---|---|---|
| 3,054,073 | 9/1962 | Powers | 332/121 |
| 3,906,401 | 9/1975 | Seidel | 332/151 |
| 4,268,802 | 5/1981 | Fisher et al. | |
| 4,324,952 | 4/1982 | Smiley | 381/16 |
| 4,373,115 | 2/1983 | Kahn | 381/15 |
| 4,485,358 | 11/1984 | Andren et al. | 332/144 |
| 4,509,017 | 4/1985 | Andren et al. | 329/308 |
| 4,584,541 | 4/1986 | Nossen | 332/145 |
| 4,700,151 | 10/1987 | Nagata | |
| 4,772,855 | 9/1988 | Buoli | 330/149 |
| 4,968,956 | 11/1990 | Huang | |
| 4,972,440 | 11/1990 | Ernst et al. | |
| 5,121,077 | 6/1992 | McGann | 330/149 |
| 5,339,054 | 8/1994 | Taguchi | |
| 5,420,536 | 5/1995 | Faulkner et al. | 330/149 |
| 5,430,416 | 7/1995 | Black et al. | |
| 5,450,044 | 9/1995 | Hulick | |
| 5,491,454 | 2/1996 | Matz | 330/149 |
| 5,506,546 | 4/1996 | Kowaguchi | 332/103 |
| 5,705,959 | 1/1998 | O'Loughlin | 332/151 |

FOREIGN PATENT DOCUMENTS

| | | |
|---|---|---|
| 0 360 178 | 3/1990 | European Pat. Off. |
| 0 522 525 | 1/1993 | European Pat. Off. |
| 0 705 010 | 4/1996 | European Pat. Off. |
| 0 5152981 | 6/1993 | Japan |
| 0 9069733 | 3/1997 | Japan |

OTHER PUBLICATIONS

Riley, T. et al., "A Simplified Continuous Phase Modulator Technique", *IEEE Transactions on Circuits and Systems*, vol. 41, No. 5, May 1994, pp. 321–328.

Riley, T. et al., "Delta–Sigma Modulation in Fractional–N Frequency Synthesis", *IEEE Journal of Solid–State Circuits*, vol. 28, No. 5, May 1993, pp. 553–559.

*Primary Examiner*—Stephen Chin
*Assistant Examiner*—Lenny Jiang
*Attorney, Agent, or Firm*—Burns, Doane, Swecker & Mathis, L.L.P.

[57] ABSTRACT

An apparatus and method generate a linearly modulated signal in a polar modulation system. A signal for transmission is separated into a phase component and an amplitude component, and a carrier signal is modulated with the phase component in a phase modulator, creating a phase distortion. A compensator compensates for the phase distortion created by the phase modulator by modifying the amplitude component. The phase modulated carrier signal is amplitude modulated by the compensated amplitude component to produce a linearly modulated signal.

12 Claims, 3 Drawing Sheets

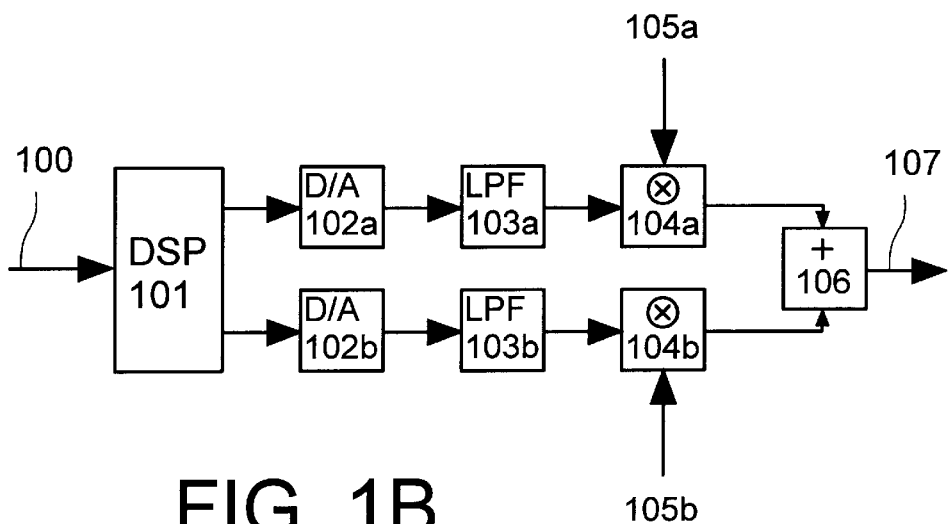
FIG. 1B
PRIOR ART
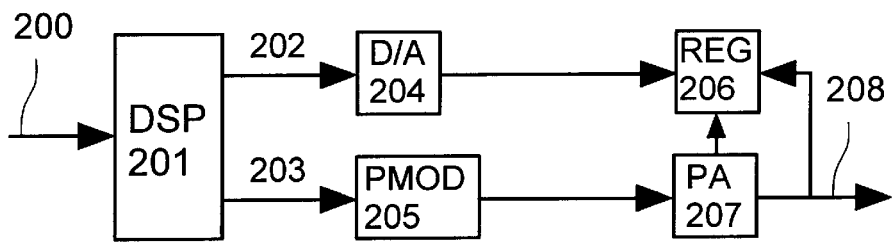
FIG. 2
PRIOR ART
FIG. 3
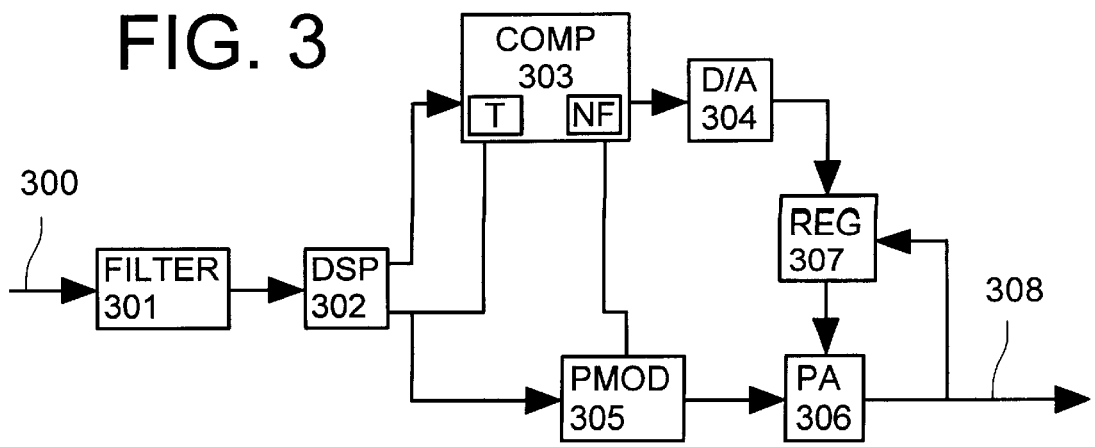

METHOD AND APPARATUS FOR GENERATING A LINEARLY MODULATED SIGNAL USING POLAR MODULATION

BACKGROUND

This invention relates generally to communication systems using polar modulation techniques. More particularly, this invention relates to a method and apparatus for generating linearly modulated signals using polar modulation in remote stations in a cellular communication system.

Modern communication systems, such as cellular and satellite radio systems, employ various modes of operation (analog, digital, dual mode, etc.), and access techniques such as frequency division multiple access (FDMA), time division multiple access (TDMA), code division multiple access (CDMA), and hybrids of these techniques.

FIG. 1A is a block diagram of an exemplary cellular mobile radiotelephone system, including an exemplary base station 110 and mobile station 120. The base station includes a control and processing unit 130 which is connected to a mobile switching center (MSC) 140 which in turn is connected to the public switched telephone network (PSTN) (not shown). General aspects of such cellular radiotelephone systems are known in the art. The base station 110 handles a plurality of voice channels through a voice channel transceiver 150, which is controlled by the control and processing unit 130. Also, each base station includes a control channel transceiver 160, which may be capable of handling more than one control channel. The control channel transceiver 160 is controlled by the control and processing unit 130. The control channel transceiver 160 broadcasts control information over the control channel of the base station or cell to mobiles locked to that control channel. It will be understood that the transceivers 150 and 160 can be implemented as a single device, like the voice and control transceiver 170, for use with control and traffic channels that share the same radio carrier.

In a typical transceiver, such as the mobile station 120, baseband communication signals are phase, frequency, or amplitude modulated on a carrier signal, and the modulated signal is transmitted from the transceiver.

There are various modulation techniques. Quadrature Amplitude Modulation (QAM) and Phase Shift Keying (PSK) are examples of linear modulation techniques. These techniques typically employ quadrature (I-Q) amplitude modulators, as illustrated in FIG. 1B. Based on the information 100 to be transmitted, a digital signal processor 101 generates digital in-phase (I) and quadrature (Q) components. These digital I and Q components are then converted to analog signals using D/A-converters 102a,b. The analog signals are low pass filtered in low pass filters 103a,b. The output of the filters 103a,b respectively modulate, using multipliers 104a,b, carrier signals 105a,b that are separated 90° in phase. The outputs of the multipliers 104a,b are summed in an adder 106 to form a signal 107 to be amplified in a power amplifier and transmitted.

Another modulation technique, which is often considered more efficient, is polar modulation. This technique is based on a polar representation of the baseband signal, as disclosed for example in U.S. Pat. No. 5,430,416 and illustrated in FIG. 2. According to this technique, polar components, i.e., amplitude (r) and phase ((p) components, are used instead of I and Q components. Based on the information 200 to be transmitted, a digital signal processor 201 generates an amplitude component 202 and a phase component 203. The phase component 203 modulates the carrier signal in a phase modulator 205, resulting in a phase modulation with constant envelope. The amplitude component 202 is converted to an analog signal in a D/A-converter 204 and then fed through a regulator 206 which adjusts the current or voltage of the signal controlling the power of a power amplifier 207 to a target power value based on the analog signal and the output signal 208. The regulated analog signal modulates the phase modulated carrier signal in the power amplifier 207 by controlling the power of the power amplifier. The resulting amplified signal 208 is then output for transmission.

To modulate the phase modulated signal with the amplitude component, it is necessary to have the amplitude component phase aligned with the phase transitions experienced by the carrier signal. In conventional polar modulation devices, phase distortions are created in components such as the power amplifier, resulting in a mis-alignment between the amplitude component and the phase modulated carrier signal. The resulting amplitude and phase modulated carrier signal will thus differ from the desired modulated carrier signal.

Various attempts have been made to solve this problem, including a technique disclosed in U.S. Pat. No. 4,972,440. According to this patent, the phase distortion introduced in the power amplifier is compensated for by applying a corresponding phase distortion to the carrier signal.

In addition to the phase distortions created by the power amplifier, there are also phase distortions created by the phase modulator which may contain components that function substantially as a low pass filter. The phase modulator is often assumed to be ideal, i.e., it is assumed that the phase modulator does not create a phase distortion. However, in actual applications, the phase modulator is not ideal and it produces a phase distortion causing a mis-alignment between the amplitude component and the phase modulated carrier signal. This may result in a distorted output signal having a frequency spectrum that is much wider than the frequency spectrum of the desired output signal. Due to this wide spectrum of the distorted output signal, the spectrum requirements for transmitting the signal may be unfulfilled. The known techniques for compensating for the phase distortions created by the power amplifier do not address the problem of phase distortions created by the phase modulator.

Thus, there is a need for a method and apparatus for compensating for phase distortions created by phase modulation in a polar modulation system.

SUMMARY

It is therefore an object of the present invention to compensate for phase distortions created by a phase modulator in a polar modulation system to produce a linearly modulated signal. It is yet another object of the present invention to fulfill spectrum requirements for transmitting a signal while taking advantage of the efficiency of polar modulation.

According to an exemplary embodiment, these and other objects are met by an apparatus and method which produce a linearly modulated signal, e.g., a QAM or a PSK signal, in a polar modulation system. A signal for transmission is separated into a phase component and an amplitude component, and a carrier signal is phase modulated with the phase component. The phase modulator creates a phase distortion which is compensated for modifying the amplitude component. The phase modulated signal is amplitude modulated by the compensated amplitude component to produce a linearly modulated signal.

BRIEF DESCRIPTION OF THE DRAWINGS

The features, objects, and advantages of this invention will become apparent by reading this description in conjunction with the accompanying drawings, in which like reference numerals refer to like elements and in which:

FIG. 1B illustrates a conventional I-Q quadrature amplitude modulator;

FIG. 2 illustrates a conventional polar modulator;

FIG. 3 illustrates an exemplary apparatus for generating a linearly modulated signal using polar modulation according to the present invention.

DETAILED DESCRIPTION

Figure 1A:
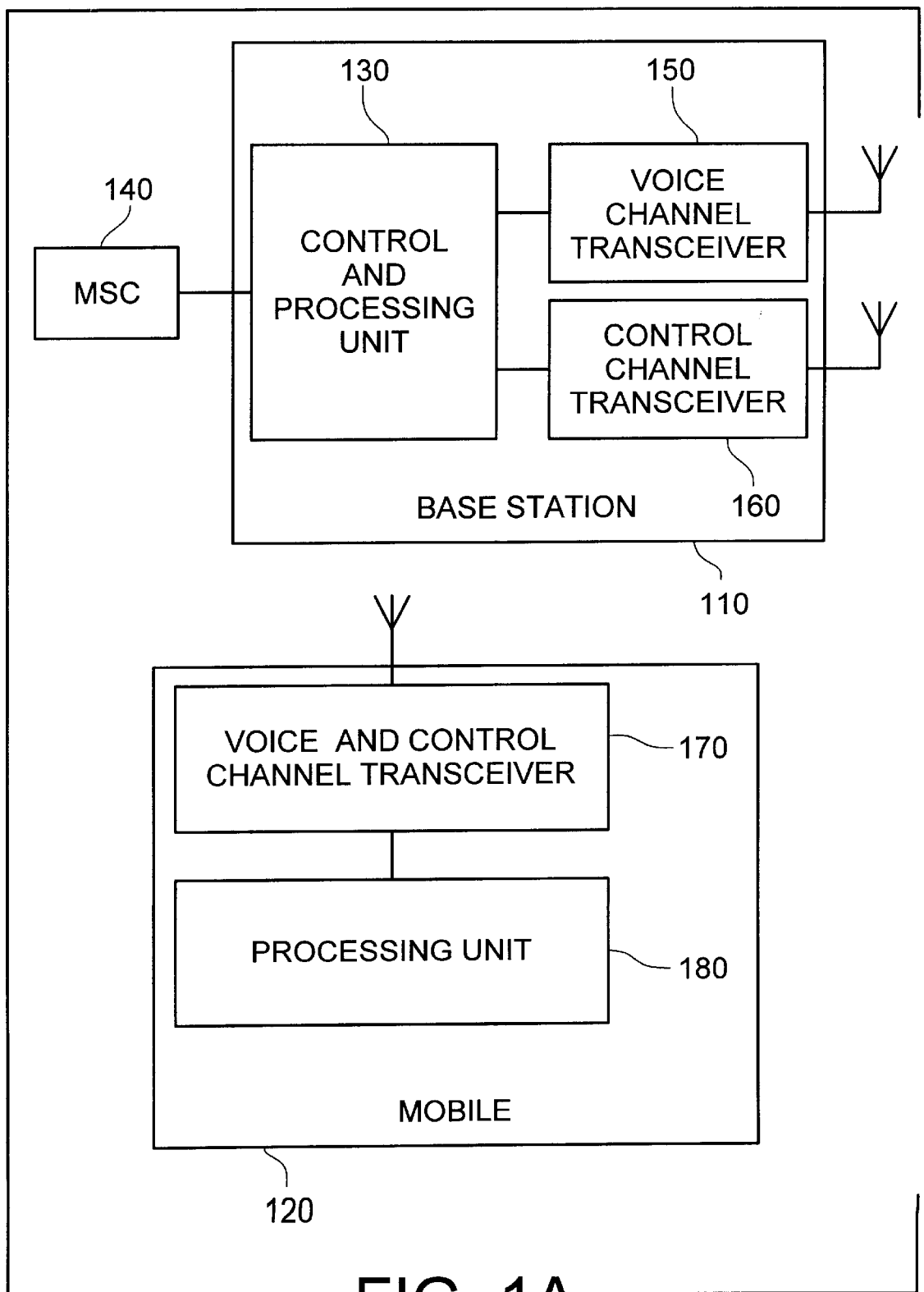
FIG. 1A illustrates a cellular communication system.

For illustrative purposes, the following description is directed to a cellular radio communication system, but it will be understood that this invention is not so limited and applies to other types of communication systems.

According to exemplary embodiments of the invention, phase distortions produced by a phase modulator in a polar modulation system are compensated for, resulting in a linearly modulated signal, e.g., a QAM or a PSK signal. An exemplary polar modulation system according to the present invention is illustrated in FIG. 3.

As illustrated in FIG. 3, information 300 to be transmitted, e.g., binary information, is first transformed into a digital waveform in a digital waveform filter 301 and then separated into phase and amplitude components in a digital signal processor 302. The phase component is fed into a phase modulator 305 where it modulates the carrier signal, resulting in a phase modulation with constant envelope. The phase modulator can be any type of conventional phase modulator, for instance an I-Q phase modulator or a $\Sigma\Delta$ fractional-N PLL modulator. Examples of such modulators are disclosed in copending U.S. patent applications No. 08/931,302 and 08/931,430, as well as in T. Riley et al., "A Simplified Continuous Phase Modulator Technique", "IEEE Transactions on Circuits and Systems-II", Vol. 41, pp. 321–326 (1994) and T. Riley et al., "Delta-sigma Modulation in Fractional-n frequency Synthesis", IEEE Transactions on SolidState Circuits, Vol. 28, pp. 553–559 (1993), herein incorporated by reference. The phase modulator 305 creates a phase distortion in the phase modulated carrier signal.

To correct for this phase distortion and provide a linearly modulated signal, the amplitude component is fed through a compensator 303 which modifies the amplitude component to compensate for the phase distortion created by the phase modulator 305. For example, the compensator 303 derives a compensation function based on the delay experienced in the phase modulator 305 as well as on the ideal phase component and the distorted phase component, i.e., the phase component including the phase distortion created by the phase modulator. The compensator 303 applies this compensation function to the amplitude component. The compensator 303 may be implemented in any number of ways to perform these functions. For example, the compensator 303 may comprise a look up table T for determining how to modify the amplitude component, e.g., for determining a compensation function, and a nonlinear digital filter NF for applying the compensation function to the amplitude component. Alternately, some or all these functions may be performed by a microprocessor.

The compensated digital amplitude component is converted to an analog signal in the D/A converter 304. The resulting analog signal is fed through a regulator 307 which adjusts the current or voltage of the signal, controlling the power of a power amplifier 306 to a target value based on the analog signal and the output signal 308. Finally, the regulated analog signal modulates the phase modulated carrier signal in the power amplifier 306, by controlling the power of the power amplifier, and the amplified signal 308 is output.

To understand how the compensator 303 works, assume the desired linearly modulated baseband signal $s_b(t)$ can be represented as:

$$s_b(t)=I(t)+jQ(t) \quad (1)$$

where I(t) is the in-phase component and Q(t) is the quadrature component of the desired linearly modulated baseband signal. The polar representation of the baseband signal is then given by:

$$r(t)=\sqrt{I^2(t)+Q^2(t)}, \ \phi(t)=\angle(I(t),Q(t)) \quad (2)$$

Then, the desired transmitted signal s(t) can be represented as:

$$s(t)=r(t)\cos(\omega_0 t+\phi_t)=r(t)\cos\phi_t\cos\omega_0 t-r(t)\sin\phi_t\sin\omega_0 t. \quad (3)$$

where $\phi_t$ is the phase component of the signal to be transmitted, r(t) is the amplitude component of the signal to be transmitted, and $\omega_0$ is the carrier frequency.

Then, the signal output from the phase modulator 305 is:

$$\tilde{p}(t)=\cos(\omega_0 t+\tilde{\phi}_{t-\tau})=\cos\tilde{\phi}_{t-\tau}\cos\omega_0 t-\sin\tilde{\phi}_{t-\tau}\sin\omega_0 t \quad (4)$$

where $\tau$ is the delay experienced by the phase component in the phase modulator 305, and $\tilde{\phi}_{t-\tau}$ is the distorted phase component.

Based on the ideal phase component and the signal output from the phase modulator 305, the compensator 303 derives a compensating function c(t) which may be given by:

$$c(t) = A(t-\tau) \cdot \frac{\cos\varphi_{t-\tau}}{\cos\tilde{\varphi}_{t-\tau}} q^{-\tau} \quad (6)$$

where $q^{-\tau}$ is a delay operator (i.e., $q^{-\tau}x(t)=x(t-\tau)$), and the function A(t) is chosen in order to make $|c(t)| \infty, \forall t$, i.e., in order to make the absolute value of the compensation c(t) function less than infinity for all t. It can been seen that Equation 4 is the optimal compensation function if $\omega_0=0$, i.e., for baseband signals.

Assuming $H_{regulator}(f)=1 \forall f$, i.e., assuming that the transfer function $H_{regulator}(f)$ of the regulator is 1 for all frequencies, the transmitted signal can now be written as:

$$s_t(t) = c(t)r(t)\tilde{p}(t) \quad (7)$$

$$= c(t)r(t)(\cos\tilde{\varphi}_{t-\tau}\cos\omega_0 t - \sin\tilde{\varphi}_{t-\tau}\sin\omega_0 t)$$

$$= r(t-\tau)(A(t-\tau)\cos\varphi_{t-\tau}\cos\omega_0 t -$$

$$A(t-\tau)\frac{\sin\tilde{\varphi}_{t-\tau}\cos\varphi_{t-\tau}}{\cos\tilde{\varphi}_{t-\tau}}\sin\omega_0 t)$$

Now, assume that the distorted phase component $\phi_t$ is given by:

$$\phi_t = \tilde{\phi}_t + \epsilon_t \tag{6}$$

where $\epsilon_t$ represents the phase error, i.e., the phase distortion between the distorted phase component and the ideal phase component. Assuming $\epsilon_t$ is small compared to $\phi_t$, then by using trigonometric identities and Taylor expansions, the following relationship exists:

$$\frac{\sin\tilde{\varphi}_t \cos\varphi_t}{\cos\tilde{\varphi}_t} \approx \frac{\sin\varphi_t + \varepsilon_t \cos\varphi_t}{1 - \varepsilon_t \tan\varphi_t} \tag{7}$$

$$\approx \sin\varphi_t + O(\varepsilon_t)$$

where $O(\epsilon_t)$ is a noise component. Thus, the compensated transmitted signal $s_t(t)$ can be written as:

$$s_t(t) = r(t)A(t)\cos\phi t \cos\omega_0 t - r(t)A(t)\sin\phi_t \sin\omega_0' t + o(\epsilon_t)\sin\omega_0' t = s(t) + o(\epsilon_t)\sin\omega_0' t \tag{8}$$

From equation 8, it can be seen that by using the compensating function of Equation 4, the transmitted signal comprises the desired signal plus a small band-limited noise component. This noise component is small and can be ignored. Thus, the compensated signal $s_t(t)$ has a frequency spectrum that fulfills the frequency spectrum requirements for the transmitted signal.

Figure 4:
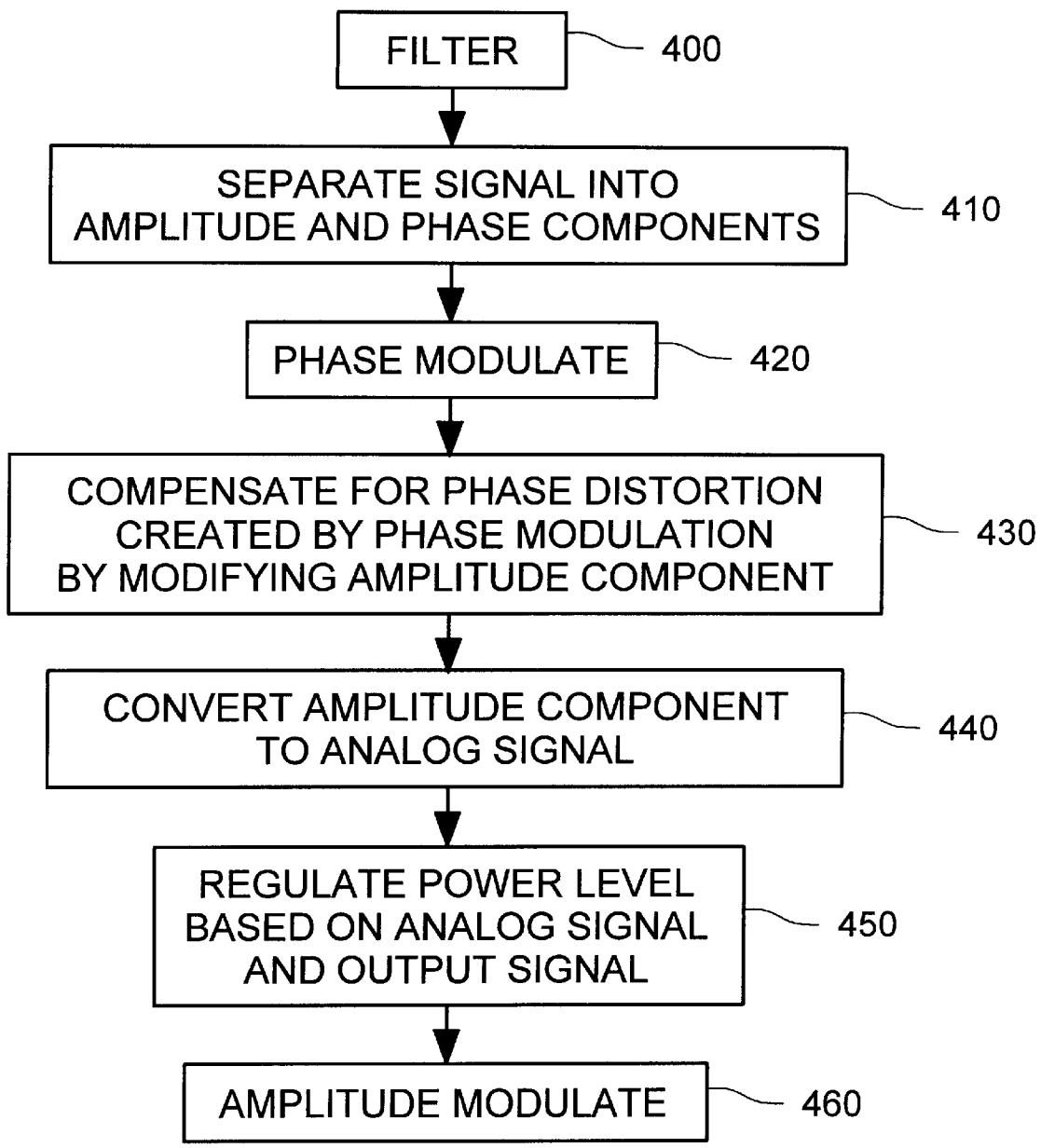
FIG. 4 illustrates an exemplary method for generating a linearly modulated signal using polar modulation according to the present invention.

FIG. 4 illustrates an exemplary method generating a linearly modulated signal using a polar modulation system according to the present invention. The method begins at step 400 at which the information to be transmitted is filtered to produce a digital waveform. Next, at step 410, the filtered signal is separated into amplitude and phase components. At step 420, the phase component modulates the carrier signal. At step 430, a phase distortion created by the phase modulation is compensated for modifying the amplitude component by applying a compensation function to the amplitude component through, for example, non-linear filtering. At step 440, the compensated amplitude component is converted into an analog signal, and at step 450, the power level of the power amplifier is regulated based on the analog signal and the output signal. At step 460, the phase modulated carrier signal is amplitude modulated producing a linearly modulated signal. Then, the linearly modulated signal is output for transmission.

According to an exemplary embodiment, an apparatus and a method generate a linearly modulated signal using polar modulation by compensating for phase distortions in phase modulation. This provides an efficient digital implementation of a linear modulator.

It will be appreciated by those of ordinary skill in the art that this invention can be embodied in other specific forms without departing from its essential character. The embodiments described above should therefore be considered in all respects to be illustrative and not restrictive.

What is claimed is:

1. An apparatus for generating a linearly modulated signal in a polar modulation system, the apparatus comprising:
    a signal processor for separating a signal for transmission into a phase component and an amplitude component;
    a phase modulator for modulating a carrier signal with the phase component, wherein the phase modulator creates a phase distortion;
    a compensator which modifies the amplitude component, compensating for the phase distortion created by the phase modulator; and
    an amplitude modulator for modulating the phase modulated carrier signal with the modified amplitude component to produce a linearly modulated signal.

2. The apparatus of claim 1, wherein the compensator modifies the amplitude component by applying a compensation function to the amplitude component based on the phase distortion that is created by the phase modulator.

3. The apparatus of claim 1, wherein the compensator delays the amplitude component by an amount of time equal to a delay experienced in the phase modulator.

4. The apparatus of claim 1, wherein the compensator comprises a non-linear filter which compensates for the phase distortion.

5. The apparatus of claim 1, wherein said apparatus is included in a cellular transceiver.

6. The apparatus of claim 1, wherein the compensator comprises a table for determining a compensation function.

7. A method for generating a linearly modulated signal in a polar modulation system, the method comprising the steps of:
    separating a signal for transmission into a phase component and an amplitude component;
    phase modulating a carrier signal with the phase component, wherein the phase modulation creases a phase distortion;
    compensating for the phase distortion created by the phase modulation by modifying the amplitude component; and
    amplitude modulating the phase modulated carrier signal with the modified amplitude component to produce a linearly modulated signal.

8. The method of claim 7, wherein the step of compensating modifies the amplitude component by applying a compensation function to the amplitude component based on the phase distortion created by the phase modulation.

9. The method of claim 7, wherein the step of compensating comprises delaying the amplitude component by an amount of time equal to a delay experienced during the phase modulation.

10. The method of claim 7, wherein the step of compensating comprises non-linear filtering the amplitude component.

11. The method of claim 7, wherein the steps are performed in a cellular transceiver in a communication system.

12. The method of claim 7, wherein the step of compensating includes referring to a table for determining a compensation function.

* * * * *